United States Patent [19]
Hwang

[11] Patent Number: 5,898,632
[45] Date of Patent: Apr. 27, 1999

[54] SENSE AMPLIFIER OF VIRTUAL GROUND FLAT-CELL

[75] Inventor: Tae-Sun Hwang, Choongcheongbuk-Do, Rep. of Korea

[73] Assignee: LG Semicon Co., Ltd., Cheongju, Rep. of Korea

[21] Appl. No.: 09/026,551

[22] Filed: Feb. 20, 1998

[30] Foreign Application Priority Data

Feb. 27, 1997 [KR] Rep. of Korea ..................... 97-6247

[51] Int. Cl.$^6$ .................................................. G11C 7/00
[52] U.S. Cl. .................. 365/208; 365/189.07; 365/207; 365/210
[58] Field of Search .............................. 365/104, 189.07, 365/205, 207, 208, 210

[56] References Cited

U.S. PATENT DOCUMENTS

| 5,117,389 | 5/1992 | Yiu ........................................... 365/104 |
| 5,148,063 | 9/1992 | Hotta ....................................... 365/208 |
| 5,301,149 | 4/1994 | Jinbo ....................................... 365/208 |
| 5,369,614 | 11/1994 | Miyanishi ................................ 365/207 |
| 5,396,467 | 3/1995 | Liu et al. .................................. 365/210 |
| 5,530,671 | 6/1996 | Hashimoto ......................... 365/189.07 |
| 5,781,489 | 7/1998 | Okamoto ................................ 365/208 |

*Primary Examiner*—Son Mai
*Attorney, Agent, or Firm*—Fleshner & Kim

[57] ABSTRACT

A sense amplifier of a virtual ground flat cell is provided that prevents leakage currents. The sense amplifier includes a first through third current/voltage converters and a voltage comparator. The third current/voltage converter maintains electric potentials substantially equal between cells adjacent and nearby a selected cell being read. In particular, the third current/voltage converter maintains electric potentials between the low cells coupled to a ground terminal not selected as a bit line. The first current/voltage converter converts a current from the selected memory cell received via a bit line to a first voltage. The second current/voltage converter converts a reference current to a reference voltage. The voltage comparator compares the first and reference voltages to output a voltage corresponding to the data stored in the selected memory cell. The third current/voltage converter uses the first voltage to convert the current sensed in the bit line into a voltage to cut off the leakage current flowing to a non-selected virtual ground side through a low cell adjacent to a high cell being read.

18 Claims, 3 Drawing Sheets

5,898,632

SENSE AMPLIFIER OF VIRTUAL GROUND FLAT-CELL

BACKGROUND OF THE INVENTION

1. Field of the Invention

The present invention relates to a memory device, and more particularly, to a sense amplifier for a memory device.

2. Background of the Related Art

FIG. 1 is a block diagram showing a sense amplifier of a virtual ground flat cell according to the related art. As shown in FIG. 1, the sense amplifier of a virtual ground flat cell includes a first current/voltage converter 11A connected to a bit line (BL) of a virtual ground flat cell for converting a current of a cell into a voltage. A second current/voltage converter 11B converts a reference current Iref into a reference voltage. A voltage comparator 12 compares outputs from the first and second current/voltage converters 11A, 11B to output a voltage corresponding to a read data.

FIG. 2 is a circuit diagram showing a virtual ground flat cell array according to the related art. When an arbitrary low cell (i.e., a cell having a low value stored therein) in the virtual ground flat cell array in FIG. 2 is read, a large current flows along the bit line (BL) to apply a high level current to the gate of an NMOS transistor (NM1) from an inverter (I1). As a result, the NMOS transistor (NM1) is turned on and a voltage from an output node (Na) of the first current/voltage converter 11A becomes lower than the reference voltage applied to an output node (Nb) from the second current/voltage converter 11B. Accordingly, the voltage comparator 12 compares the voltages from the output nodes (Na, Nb) to output a low level of a ground voltage (Vss), which becomes an output (DATA OUT) from the sense amplifier.

When an arbitrary high cell (i.e., a cell having a high value stored therein) in the virtual ground flat cell array is read, a small current flows along the bit line (BL). As a result, the voltage from the output node (Na) of the first current/voltage converter 11A becomes higher than the reference voltage applied to the output node (Nb). Accordingly, the voltage comparator 12 compares the voltages from the output nodes (Na, Nb) to generate a high level source voltage (Vcc), which becomes the output (DATA OUT) from the sense amplifier. The voltage comparator 12 includes a differential amplifier type voltage comparator and an inverter type voltage comparator.

As an example, a read path will now be described. The read path as shown in FIG. 2 is initially described where a high cell of an NMOS transistor (NM35) is read and then where a low cell of an NMOS transistor (NM34) is read.

When the high cell of the NMOS transistor (NM35) is read, a bank select signal (SEL1), a word line signal (WL0) and a left-right select signal (/SEL2) are applied as a high level while the other signals are applied as a low level. Accordingly, the bit line (BL) is connected to the ground terminal (Vss), sequentially through a metal contact (MC3) and NMOS transistors (NM13, NM35, NM52, NM12).

When the low cell of the NMOS transistor (NM34) is read, the bank select signal (SEL1), the word line signal (WL0) and a bank select signal (SEL2) are applied as a high level while the other signals are applied as a low level. Accordingly, the bit line (BL) is connected to the ground terminal (Vss), sequentially through a metal contact (MC3) and NMOS transistors (NM13, NM22, NM34, NM12).

However, when NMOS transistors (NM36, NM37), which are adjacent to the NMOS transistor (NM35) are low cells, and the high cell of the NMOS transistor (NM35) is read, a leakage current flows toward the ground sides not selected. That is, the leakage current flows toward the side of the NMOS transistors (NM36, NM37). When the leakage current exceeds the reference current, a large current flows along the bit line (BL) similar to the case when the low cell is read. As a result, the voltage from the output node (Na) becomes lower than the reference voltage from the output node (Nb). Therefore, the voltage comparator 12 improperly generates a low level ground voltage (Vss) as when the low cell (NM34) is read.

As described above the related art sense amplifier has various disadvantages. When a low cell is positioned adjacent a high cell when the high cell is read in the related art sense amplifier for a virtual ground flat cell, a leakage current flows in accordance with the low cell. Further, when the leakage current exceeds the reference value, the sense amplifier performs an erroneous operation.

The above references are incorporated by reference herein where appropriate for appropriate teachings of additional or alternative details, features and/or technical background.

SUMMARY OF THE INVENTION

An object of the present invention is to substantially obviate the above-described problems in the related art.

Another object of the present invention is to prevent a leakage current.

A further object of the present invention is to provide a sense amplifier for a virtual ground flat cell that prevents a leakage current from flowing toward a ground terminal side.

A still further object of the present invention is to provide a sense amplifier for a virtual ground flat cell that makes the electric potentials between adjacent cells to have substantially equal values.

To achieve at least the above objects in a whole or in parts, there is provided sense amplifier for a virtual ground flat cell according to the present invention that includes a first current/voltage converter coupled to a bit line of a virtual ground flat cell for converting a current of a cell into a voltage, a second current/voltage converter for converting a reference current into a voltage, a third current/voltage converter for maintaining electric potentials between the low cells adjacent to the high cells to have equal values by using a voltage outputted from the first current/voltage converter, and a voltage comparator for comparing outputs from the first and second current/voltage converters to output a voltage corresponding to a read data.

The present invention can be also achieved in a whole or in parts by a memory device including a plurality of memory cells arranged in a matrix form, each cell coupled to first and second signal lines, a first current/voltage converter coupled to a first signal line to convert a current from a selected memory cell into a first voltage, a second current/voltage converter that converts a reference current into a reference voltage, a voltage comparator that compares outputs from the first and second current/voltage converters to output a voltage corresponding to data read from the selected cell, and a voltage maintaining circuit coupled between the first current/voltage converter and the voltage comparator.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 3:
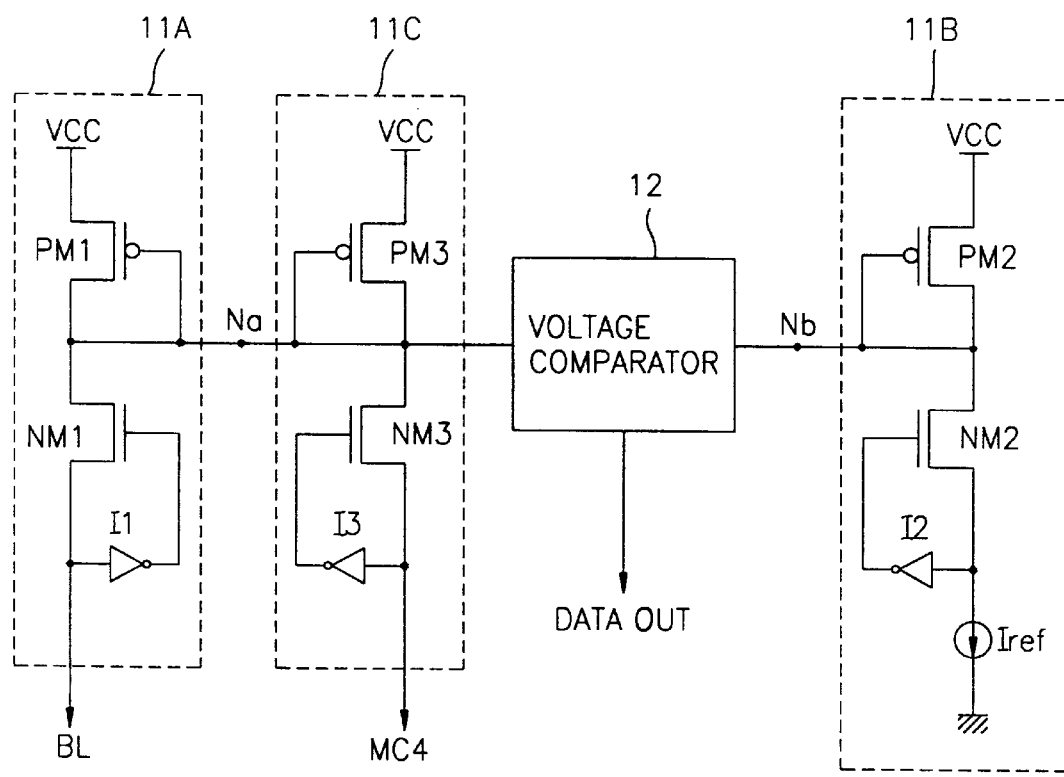
FIG. 3 is a block diagram showing a preferred embodiment of a sense amplifier of a virtual ground flat cell according to the present invention.

FIG. 3 is a diagram showing a sense amplifier of a virtual ground flat cell according to one preferred embodiment of the present invention. As shown in FIG. 3, the sense amplifier of a virtual ground flat cell includes a first current/voltage converter 11A coupled to a bit line (BL) of a virtual ground flat cell for converting a current of a cell into a voltage. A second current/voltage converter 11B converts a reference current into a reference voltage. A third current/voltage converter 11C maintains electric potentials of the low cells adjacent to high cells to have equal values by using a voltage outputted from the first current/voltage converter 11A. A voltage comparator 12 compares outputs from the first and second current/voltage converters 11A, 11B to output a voltage DATA OUT) corresponding to a read data.

Operations and effects of the preferred embodiment will now be described. When a low cell is read, a large current flows along the bit line (BL) and as a result, the voltage from the output node (Na) becomes lower than the reference voltage applied to the output node (Nb) from the second current/voltage converter 11B. The voltage comparator 12 compares the voltages of the output nodes (Na, Nb) to generate a low level ground voltage (Vss).

When an arbitrary high cell is read on the virtual ground flat cell array of the preferred embodiment, a small current flows along the bit line (BL). Consequently, the voltage of the output node (Na) of the first current/voltage converter 11A becomes higher than the reference voltage applied to the output node (Nb). In this case, the voltage comparator 12 compares the voltages of the output nodes (Na, Nb) to output a high level source voltage (Vcc).

Figure 1:
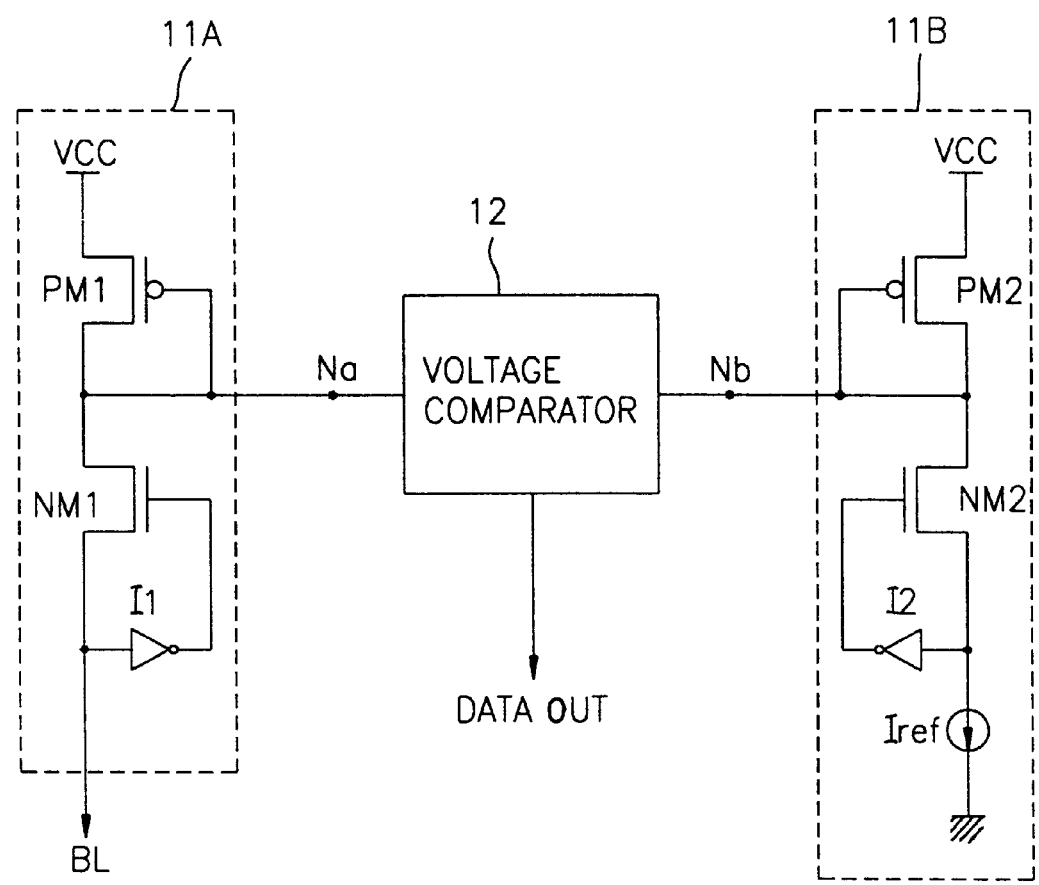
FIG. 1 is a block diagram showing a related art sense amplifier of a virtual ground flat cell.
Figure 2:
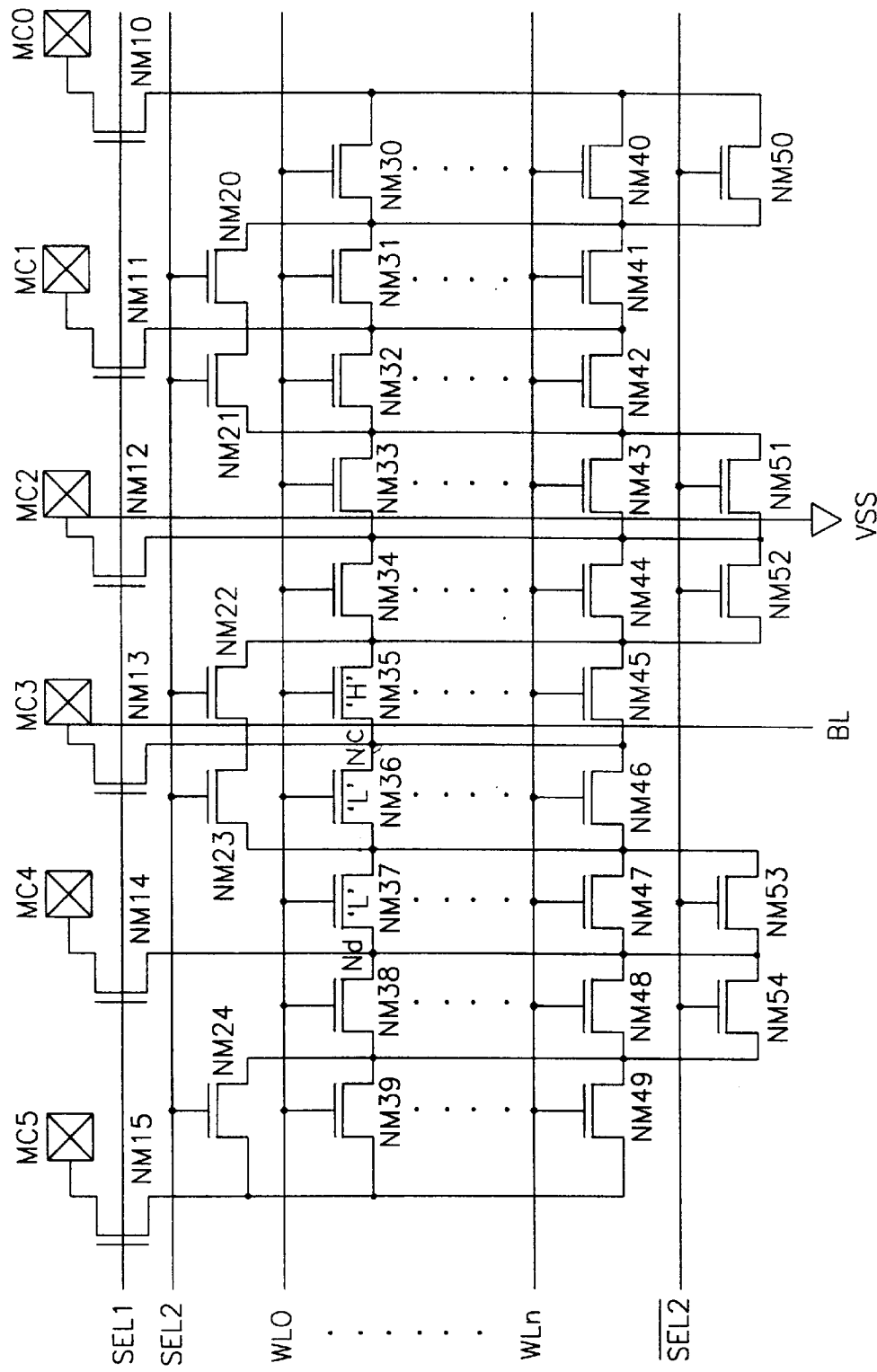
FIG. 2 is a circuit diagram showing a related art virtual ground flat cell array.

When a high cell is read on the virtual ground flat cell array of FIG. 2, although a low cell is located on an adjacent position, no leakage current flows because of the existence of the third current/voltage converter 11C in the preferred embodiment. For example, when a high cell of the NMOS transistor (NM35) is read in FIG. 2, a bank select signal (SEL1), a word line signal (WL0) a left-right select signal (/SEL2) are applied high level while the other signals are applied low level. Accordingly, the bit line (BL) is coupled to the ground terminal (Vss) by sequentially passing through a metal contact (MC3) and NMOS transistors (NM13, NM35, NM52, NM12). A condition that causes the leakage current in the related art can be established, for example, when the NMOS transistors (NM36, NM37) adjacent to the NMOS transistor (NM35) are both low cells. In this case, the effect is that a large current flows along the bit line (BL) because the leakage current flowing through the NMOS transistors (NM36, NM37).

In the preferred embodiment, however, the source voltage (Vcc) is applied to a node (Nd) through a PMOS transistor (PM3), an NMOS transistor (NM3), the metal contact (MC3) and the NMOS transistor 13. As a result, the voltages between the nodes (Nc, Nd) are equal. That is, the voltage between the sources of the NMOS transistors (NM13, NM37) are maintained to have an equal value, which results in cutting off the leakage current flowing through the NMOS transistors (NM36, NM37).

Accordingly, the voltage of the output node (Na) is compensated to exceed the voltage of the output node (Nb). Consequently, the sense amplifier 12 outputs a high level source voltage (Vcc) as the output DATA OUT), not a low level ground voltage (Vss) as in the related art.

Alternatively, to cut off the leakage current, the isolating third current/voltage converter 11C can be used in every four or eight cells instead of using the single current/voltage converter 11A as in the related art. However, to ensure the cutting off of the leakage current, a fixed ground flat cell with the third current/voltage converter can be implemented with a 20% increase of a chip area.

As described the preferred embodiment of above, the present invention has various advantages. When a low cell exists in a position adjacent to a read high cell, no leakage current occurs by using a separate current/voltage converter to maintain the voltages between the low cells to have an equal value. Thus, the preferred embodiment prevents the erroneous operation of the sense amplifier and an increase speed of more than 20% can be ensured in comparison with the speed of a ROM or a flash memory in which a related art virtual ground flat cell is employed. Further, when the preferred embodiment replaces a related art memory having a fixed ground flat cell, the speed is similar but a 20% decrease is expected in a chip size.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An amplifier for a memory device, comprising:
   a first current/voltage converter coupled to a signal line to convert a current from a selected memory cell into a first voltage;
   a second current/voltage converter that converts a reference current into a reference voltage;
   a voltage comparator that compares outputs from the first and second current/voltage converters to output a voltage corresponding to data read from the selected cell of the memory device; and
   a third current/voltage converter coupled between the first current/voltage converter and the voltage comparator.

2. The amplifier of claim 1, wherein the third current/voltage comparator maintains substantially equal electric potentials between the selected cell and an adjacent cell.

3. The amplifier of claim 2, wherein the selected cell being read stores a high data value and the adjacent cell stores a low data value.

4. The amplifier of claim 1, wherein the third current/voltage comparator receives the first voltage and maintains the equal potentials based on the first voltage.

5. The amplifier of claim 1, wherein the third current/voltage converter is arranged every predetermined number of cells.

6. The amplifier of claim 5, wherein the predetermined number of cells is at least one of four cells and eight cells.

7. The amplifier of claim 1, wherein the third current/voltage converter prevents a leakage current.

8. The amplifier of claim 7, wherein the leakage current passes through cells adjacent to the selected cell being read.

9. The amplifier of claim 1, wherein the memory cell is a virtual ground flat cell and the memory device includes a plurality of memory cells.

10. The amplifier of claim 1, wherein the third current/voltage converter comprises:
- a first transistor having a first electrode coupled to a control electrode through an inverter; and
- a second transistor having a second electrode and a control electrode that both receive the first voltage, wherein second electrodes of the first and second transistors are coupled, and wherein a first electrode of the second transistor is coupled to a first reference voltage.

11. The amplifier of claim 10, wherein the first transistor is an NMOS transistor and the second transistor is a PMOS transistor, wherein the control, first and second electrodes are respectively a gate, source and drain electrodes, and wherein the first reference voltage is a supply voltage.

12. The amplifier of claim 1, wherein the third current/voltage converter is coupled to a corresponding metal contact of the memory device.

13. The amplifier of claim 1, wherein the third current/voltage converter maintains electric potentials between memory cells.

14. A memory device, comprising:
- a plurality of memory cells arranged in a matrix form, each cell coupled to first and second signal lines;
- a first current/voltage converter coupled to a first signal line to convert a current from a selected memory cell into a first voltage;
- a second current/voltage converter that converts a reference current into a reference voltage;
- a voltage comparator that compares outputs from the first and second current/voltage converters to output a voltage corresponding to data read from the selected cell; and
- a voltage maintaining circuit coupled between the first current/voltage converter and the voltage comparator.

15. The memory device of claim 14, wherein the voltage maintaining circuit is a third current/voltage converter that maintains electric potentials between memory cells.

16. The memory device of claim 15, wherein the voltage maintaining circuit receives the first voltage and maintains the equal potentials based on the first voltage.

17. The memory device of claim 14, wherein the voltage maintaining circuit maintains substantially equal electric potentials between the selected cell storing a high data value and an adjacent cell storing a low data value.

18. The memory device of claim 14, wherein the voltage maintaining circuit is arranged every predetermined number of cells.

* * * * *